United States Patent
Moss et al.

(10) Patent No.: US 10,375,863 B2
(45) Date of Patent: Aug. 6, 2019

(54) LIQUID COOLED CHASSIS

(71) Applicant: DELL PRODUCTS, L.P., Round Rock, TX (US)

(72) Inventors: David L. Moss, Austin, TX (US); William K. Coxe, Round Rock, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 15/825,010

(22) Filed: Nov. 28, 2017

(65) Prior Publication Data

US 2019/0166724 A1  May 30, 2019

(51) Int. Cl.
*H05K 7/20* (2006.01)
*H05K 7/14* (2006.01)

(52) U.S. Cl.
CPC ....... *H05K 7/20781* (2013.01); *H05K 7/1488* (2013.01); *H05K 7/207* (2013.01); *H05K 7/20554* (2013.01); *H05K 7/20627* (2013.01); *H05K 7/20663* (2013.01); *H05K 7/20754* (2013.01); *H05K 7/20772* (2013.01)

(58) Field of Classification Search
CPC ........... H05K 7/20218; H05K 7/20272; H05K 7/20627–20645; H05K 7/20763–20781; H05K 7/1488; H05K 7/20554; H05K 7/20672; H05K 7/20663; G06F 1/20; G06F 1/203
USPC .................................. 361/699, 679.53, 702
See application file for complete search history.

(56) References Cited

U.S. PATENT DOCUMENTS

| | | | | |
|---|---|---|---|---|
| 4,462,462 A * | 7/1984 | Meagher | ............. | H01L 23/4338 165/80.1 |
| 4,558,395 A * | 12/1985 | Yamada | ............. | H01L 23/4332 257/E23.091 |
| 4,644,385 A * | 2/1987 | Nakanishi | ........... | H01L 23/4332 165/80.4 |
| 5,036,384 A * | 7/1991 | Umezawa | ............. | H01L 23/433 257/714 |
| 6,108,208 A * | 8/2000 | Tustaniwskyj | ...... | H01L 23/3736 165/121 |
| 7,403,384 B2 | 7/2008 | Pflueger | | |
| 8,405,975 B2 | 3/2013 | Helberg et al. | | |
| 8,913,391 B2 * | 12/2014 | Ling | .................. | H05K 7/20545 165/185 |
| 8,934,244 B2 | 1/2015 | Shelnutt et al. | | |
| 2002/0062855 A1 * | 5/2002 | Chu | ........................ | H01L 23/38 136/230 |
| 2007/0091569 A1 * | 4/2007 | Campbell | ........... | H01L 23/4338 361/699 |

(Continued)

*Primary Examiner* — Dion Ferguson
*Assistant Examiner* — Amir A Jalali
(74) *Attorney, Agent, or Firm* — Isidore PLLC

(57) ABSTRACT

An information handling system (IHS) includes a node enclosure containing one or more heat-generating functional components. A cold plate is attached to an inner surface of the node enclosure. The cold plate presents a conduction surface to a selected at least one of the one or more heat-generating functional components. A spring is positioned between the inner surface of the node enclosure and the cold plate. The spring positions the conduction surface into conductive proximity with the selected at least one of the one or more heat-generating functional components.

16 Claims, 7 Drawing Sheets

(56) References Cited

U.S. PATENT DOCUMENTS

| | | | |
|---|---|---|---|
| 2007/0091570 A1* | 4/2007 | Campbell | G06F 1/20 |
| | | | 361/699 |
| 2013/0112378 A1 | 5/2013 | Shelnutt et al. | |
| 2013/0312839 A1 | 11/2013 | Shelnutt et al. | |
| 2014/0321056 A1* | 10/2014 | Yoshikawa | H05K 7/20818 |
| | | | 361/697 |
| 2017/0181324 A1* | 6/2017 | Shelnutt | H05K 7/20781 |
| 2017/0181329 A1* | 6/2017 | Shelnutt | H05K 7/20763 |
| 2018/0042137 A1* | 2/2018 | Reeves | H01L 23/473 |

\* cited by examiner

LIQUID COOLED CHASSIS

BACKGROUND

1. Technical Field

The present disclosure generally relates to information handling systems (IHS), and more particularly to a liquid cooled (LC) rack-configured IHS (RIHS).

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These functional nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, generating greater heat dissipation needs per node and requiring more directed cooling solutions. Some implementations of rack mounted IHSs are only able to fill about half of the available space within a node due to limits of air cooling. Thus, there is a continuing need for further innovations to provide directed cooling for the individual heat generating components, both at the individual node level, as well as at the larger rack level.

BRIEF SUMMARY

The illustrative embodiments of the present disclosure provide an information handling system (IHS) that includes a node enclosure containing one or more heat-generating functional components. A cold plate is attached to an inner surface of the node enclosure. The cold plate presents a conduction surface to at least one of the one or more heat-generating functional components. A spring is positioned between the inner surface of the node enclosure and the cold plate. The spring positions the conduction surface into conductive proximity with the at least one of the one or more heat-generating functional components.

According to one aspect, a liquid cooling (LC) subsystem includes a cold plate attachable to an inner surface of a node enclosure of an IHS. The cold plate presents a conduction surface to at least one of one or more heat-generating functional components inside the node enclosure. A spring is positionable between the inner surface of the node enclosure and the cold plate to position the conduction surface into conductive contact with the at least one of the one or more heat-generating functional components.

In one aspect, a method includes attaching a cold plate of a liquid cooling subsystem to an inner surface of a node enclosure of an IHS. The method includes inserting a spring between the cold plate and an inner surface of the node enclosure. The method includes presenting a conduction surface of the cold plate to a selected one or more heat-generating functional components physically located within the node enclosure of the IHS.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
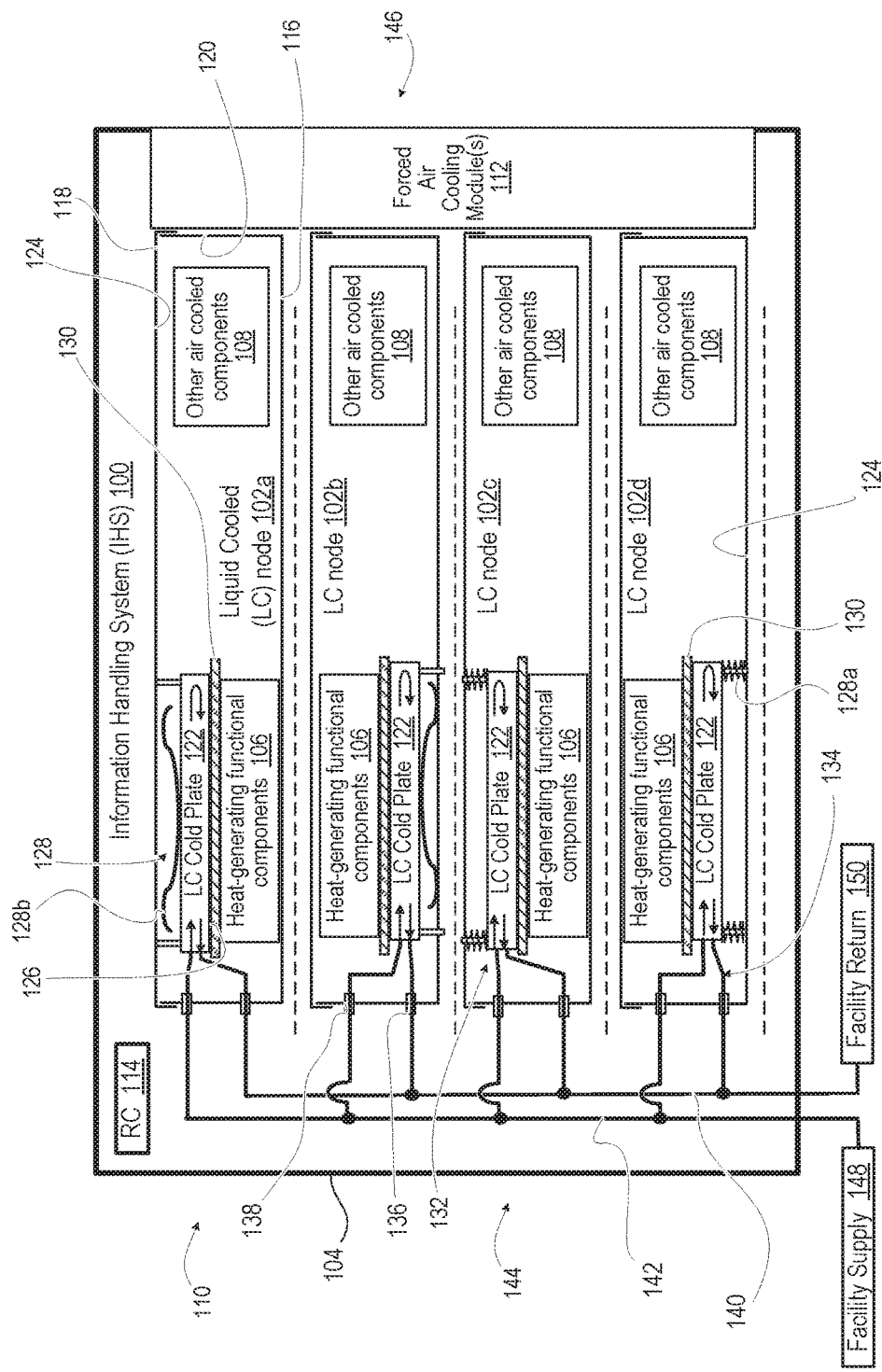
FIG. 1 illustrates a side perspective view of an internal layout/configuration of an example liquid-cooled (LC) rack-configured information handling system (RIHS), according to one or more embodiments.

The present disclosure generally provides an information handling system (IHS) that includes a node enclosure containing one or more heat-generating functional components. A cold plate is attached to an inner surface of the node enclosure. The cold plate presents a conduction surface to a selected one or more heat-generating functional components. A spring is positioned between the inner surface of the node enclosure and the cold plate. The spring positions the conduction surface into conductive proximity with the selected one or more heat-generating functional components.

In one or more embodiments, two GPUs are cooled by two serially-connected, chassis mounted liquid cooled plates. Rather than being permanently mounted to a graphics processing unit (GPU) or central processing unit (CPU), cold plates are attached, with spring mounting, to one or both of a bottom panel and a top cover of a chassis of a node. Spring mounting of each cold plate takes up any spacing tolerances and applies sufficient pressure to a thermal joint for thermal conduction. The thermal joint can include a thin compliant, thermally conductive member ("thin gap pad") to ensure even contact and pressure. Cold plates that are attached to the same surface of the chassis can be connected in series to reduce the number of required fluid quick disconnects. In an embodiment, the cold plates are attached proximate to a front of the chassis, enabling easier installation and servicing of the liquid cooling portions of an IHS while allowing air cooling equipment for other functional components to be mounted at a rear side of the chassis.

According to one aspect, the liquid cooled cold plates have a reduced height as compared to an air cooled heat sink and air shroud that would otherwise be used. Additionally, with the cold plate embedded in the chassis, an opportunity exists to build in volumetric compensation within the liquid cooling loop. For example, an air spring provided in a stub tube extending from a liquid conduit can absorb changes in fluid volume.

In the following detailed description of embodiments of the disclosure, specific embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As utilized herein, the term rack-configured information handling system" (RIHS) generally refers to the configuration of a large scale server system within a physical rack having multiple chassis receiving rails for receiving specific sizes of information technology (IT) nodes, such as server modules, storage modules, and power modules. The term "node" generally refers to each separate unit inserted into a 1 U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an IHS (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communication with external devices as well as various input and output (I/O) devices, such as a keyboard, a mouse, and a video display. The IHS may also include one or more buses operable to transmit communications between the various hardware components.

As illustrated by the figures and described herein, multiple processing servers or server IHSs (referred to herein as server nodes) can be included within a single RIHS. Certain aspects of the disclosure relate to the specific liquid cooled (LC) server or other nodes and the functionality associated with these individual nodes or block-level groupings of nodes, while other aspects more generally relate to an overall LC RIHS containing all of the LC nodes.

FIG. 1 illustrates a side perspective view of an internal layout/configuration of an example LC RIHS 100 configured with a plurality of LC nodes 102a-102d, according to one or more embodiments. For simplicity, the example LC RIHS presented in the various illustrations can be described herein as simply RIHS 100; however, references to RIHS 100 are understood to refer to a LC RIHS, with the associated liquid cooling infrastructure and/or subsystems and supported LC nodes 102a-102d. RIHS 100 includes rack 104, which comprises a rack frame and side panels, creating a front-to-back cabinet within which a plurality of chassis receiving bays are vertically arranged. A chassis of a respective information technology (IT) LC node 102a-102d can be inserted into one of the chassis receiving bays. Rack 104 includes certain physical support structures (not specifically shown) that support IT gear insertion at each node location.

Each node 102a-102d includes LC heat-generating functional components 106, which in an embodiment are GPUs. In the illustrative embodiments, LC nodes 102a-102d include other heating generating components 108 that are sufficiently cooled by reduction in ambient temperature attributable to one or more of: (i) a front-mounted LC system 110; (ii) a rear-mounted forced air cooling module(s) 112; or thermal conduction to the rack 104. In the illustrative embodiments, the LC nodes 102a-102d are vertically arranged. In one or more alternate embodiments, at least portions of the LC nodes 102a-102d (and potentially all of the nodes) may also be arranged horizontally while benefiting from aspects of the present innovation.

The present innovation is not limited to any specific number or configuration of nodes 102a-102d in a rack 104. According to one aspect, nodes 102 can be of different physical heights of form factors (e.g., 1 U, 1.5 U, 2 U), and the described features can also be applied to nodes 102a-102d having different widths and depths (into the rack), with some extensions made and/or lateral modifications to the placement of cooling subsystem conduits, as needed to accommodate the different physical dimensions. Different types of IT components can be provided within each LC node 102a-102d, with each node possibly performing different functions within RIHS 100. Thus, for example, a given node 102a-102d may include one of a server module, a power module, a control module, or a storage module. In a simplest configuration, LC nodes 102a-102d can be individual nodes operating independent of each other, with LC RIHS 100 including at least one rack-level controller (RC) 114 for controlling operational conditions within LC RIHS 100, such as temperature, power consumption, communication, and the like.

Each node 102a-102d has a node enclosure 116 that includes a top cover 118 on a bottom portion 120. A cold plate 122 is attached to an inner surface 124 of either the top cover 118 or the bottom portion 120 of the node enclosure 116. Compartments within the same node enclosure 116 can be interleaved with cold plates 122 mounted to both the top and the bottom. The cold plate 122 presents a conduction surface 126 to a selected one or more heat-generating functional components 106. A spring 128, such as a compression spring 128a or a leaf spring 128b, is positioned between the inner surface 124 of the node enclosure 116 and the cold plate 122. The spring 128 positions the conduction surface 126 into conductive proximity with the selected one or more heat-generating functional components 106. For components with tight manufacturing tolerances, the conductive proximity can be direct contact. In an embodiment, conductive proximity is provided by being pressed against a thin compliant, thermally conductive member or thin gap pad 130 that in turn is in contact with the heat-generating functional component 106.

The cold plate 122, the spring 128, and the compliant, thermally conductive member (thin gap pad 130) form a cold plate assembly 132 that can be connected in parallel or in series to another cold plate assembly 132 via an internal liquid conduit assembly 134. One or more pairs of liquid input and output ports 138, 136 are presented on a side of the node enclosure 116 to provide cooling liquid flow through the cold plate assemblies 132 and the internal liquid conduit assembly 134. In an embodiment, a liquid supply conduit 142 and liquid return conduit 140 are rack mounted to a front side 144 of the rack 104 so as not to interfere with the forced air cooling module(s) 112 on a rear side 146 of the rack 104. The liquid supply conduit 142 is connected to a facility supply 148 and the liquid return conduit 140 is connected to a facility return 150.

Figure 2:
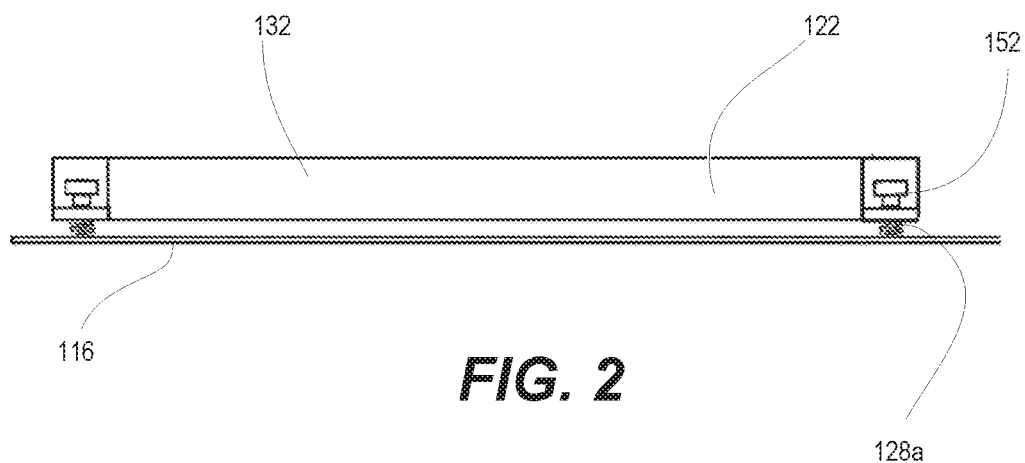
FIG. 2 illustrates a side detail view of a cold plate assembly that incorporates compression springs, according to one or more embodiments.
Figure 3:
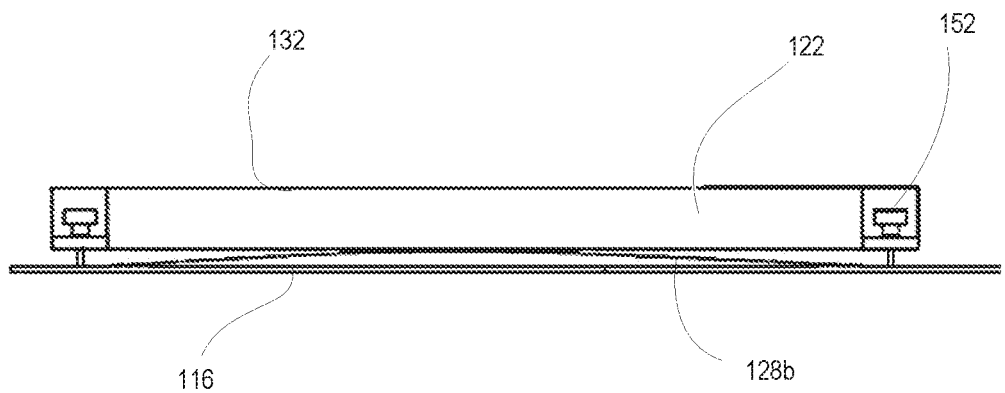
FIG. 3 illustrates a side detail view of a cold plate assembly that incorporates leaf springs, according to one or more embodiments.

FIG. 2 illustrates a cold plate assembly 132 having a cold plate 122 that is attached by shoulder screws 152 to an enclosure 116 and biased by compression springs 128a. FIG. 3 illustrates a cold plate assembly 132 having a cold plate 122 that is attached by shoulder screws 152 to an enclosure 116 and biased by a leaf spring 128b. Heat-generating functional components 106 can be fixedly attached to the enclosure 116. The requisite amount of pressure is supplied by the springs 128a, 128 to provide thermal conduction. For example, the enclosure 116 can be provisioned with cold plate assembly 132 before installing the heat-generating functional component 106, alleviating a servicing step that otherwise has to be accomplished at the customer site.

Figure 4:
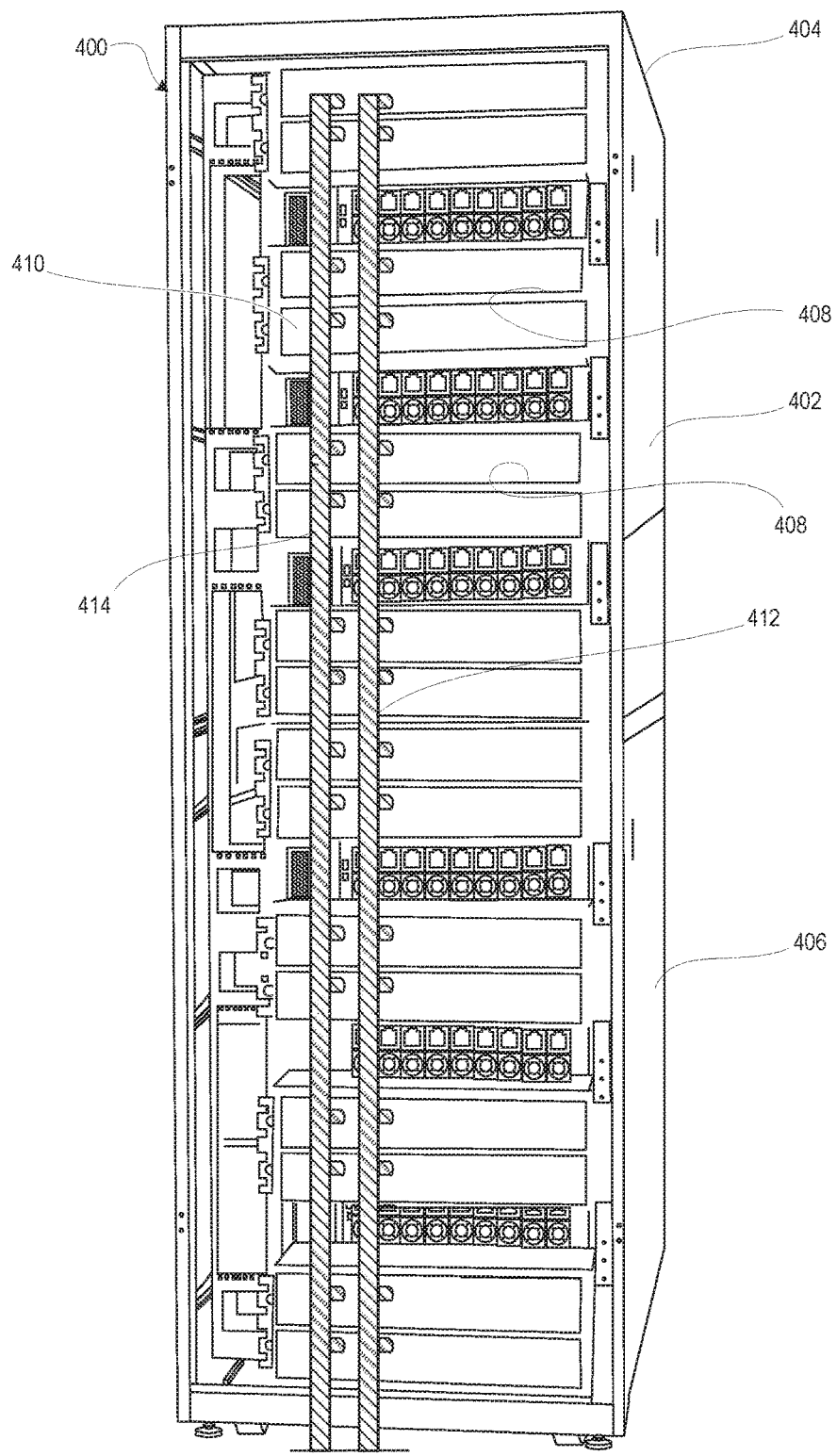
FIG. 4 illustrates a front perspective view of an example RIHS having front mounted liquid supply and return conduits, according to one or more embodiments.

FIG. 4 illustrates a front exterior view of a RHIS 400 that includes opposing side panels 402, attached to a top panel 404 (and bottom panel—not shown) to create a main cabinet enclosure 406. The main cabinet enclosure 406 includes multiple chassis receiving bays 408 for housing LC nodes 410, such as the nodes 102a-102d of FIG. 1. Liquid supply conduit 412 and liquid return conduit 414 are mounted to the LC nodes 410.

Figure 5:
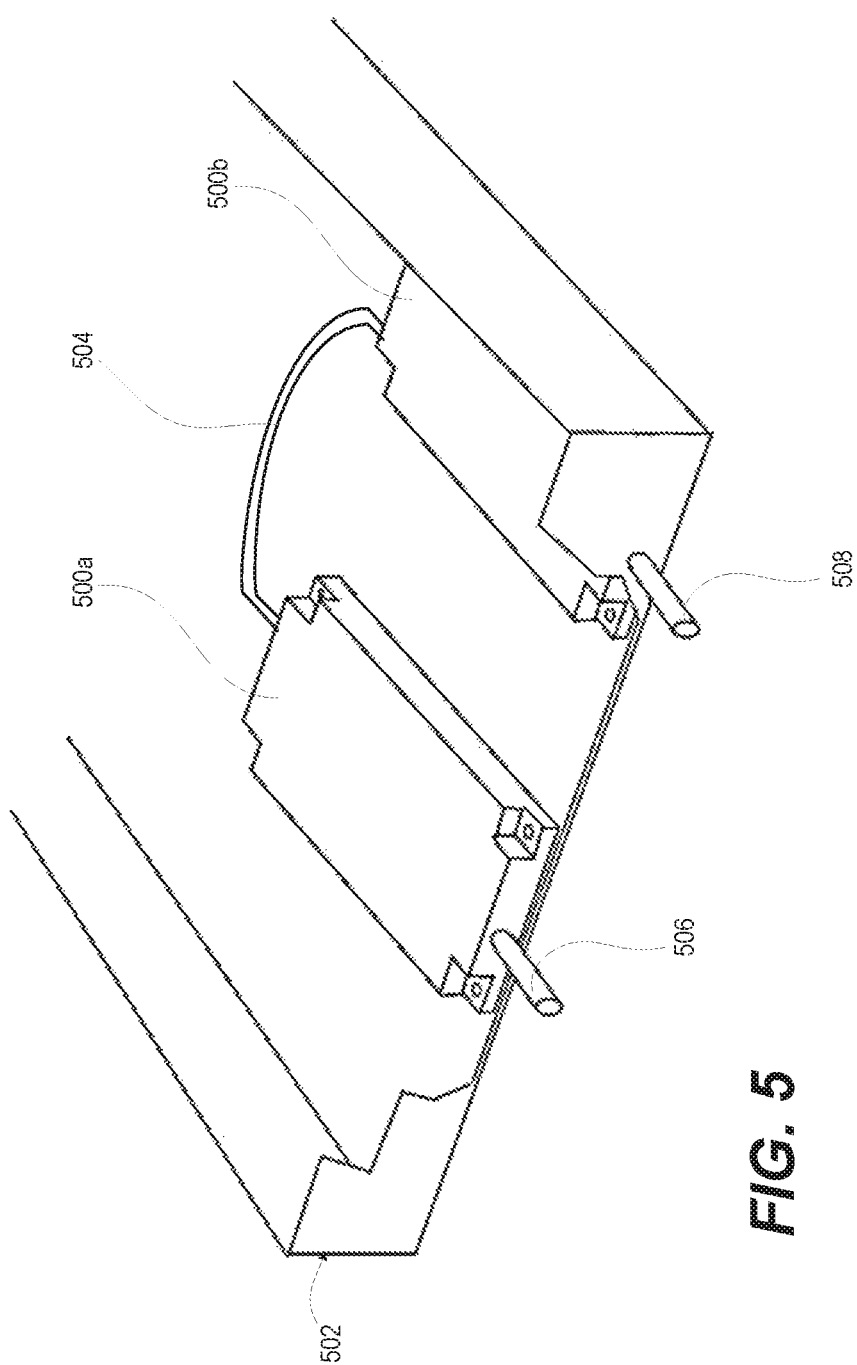
FIG. 5 illustrates a front isometric view of a node enclosure partially cutaway to show series coupled cold plate assemblies, according to one or more embodiments.
Figure 6:
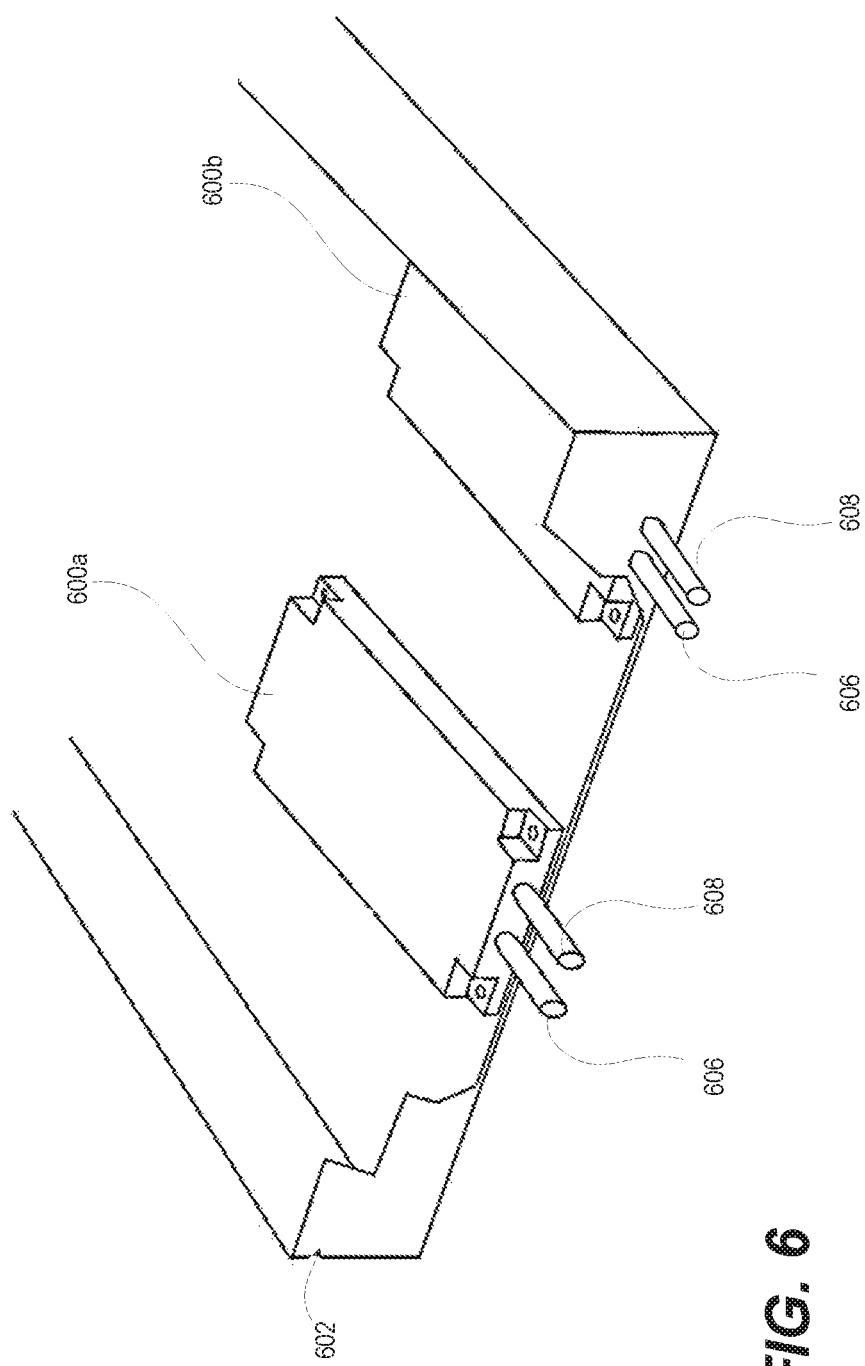
FIG. 6 illustrates a front isometric view of a node enclosure partially cutaway to show uncoupled or parallel cold plate assemblies, according to one or more embodiments.

FIG. 5 illustrates example first and second cold plate assemblies 500a-500b attached to an enclosure 502. The first and second cold plate assemblies 500a-500b are coupled in series by an internal liquid conduit assembly 504 between a liquid input port 506 and a liquid output port 508. FIG. 6 illustrates example first and second cold plate assemblies 600 attached to an enclosure 602. The first and second cold plate assemblies 600 are coupled in parallel by each having a dedicated liquid input port 606 and a liquid output port 608. Thus, there is not a pre-heating of one cold plate assembly 600 by the other, although the number of ports is doubled.

Figure 7:
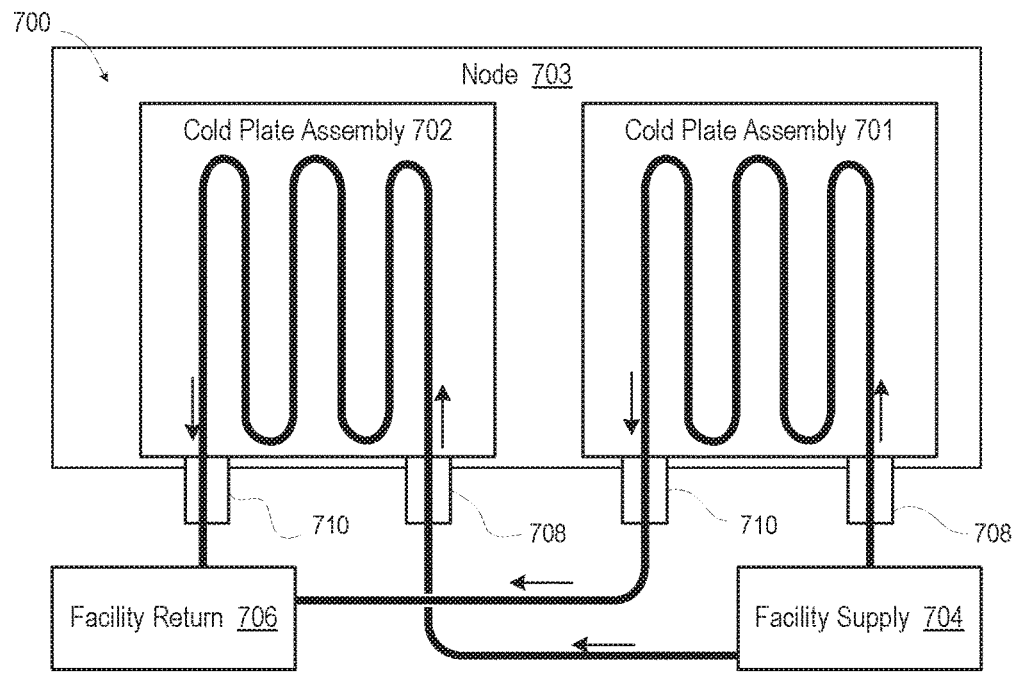
FIG. 7 illustrates a diagrammatic view of parallel fluid flow through a pair of cold plates, according to one or more embodiments.

FIG. 7 illustrates a LC subsystem 700 having first and second cold plates 701, 702 inside of a node 703 and in parallel fluid connection to a facility supply 704 and a facility return 706. Each cold plate 701, 702 has dedicated liquid input and output ports 708, 710 that are respectively coupled to the facility supply 704 and a facility return 706. No fluid flows directly between the first and second cold plates 701, 702.

Figure 8:
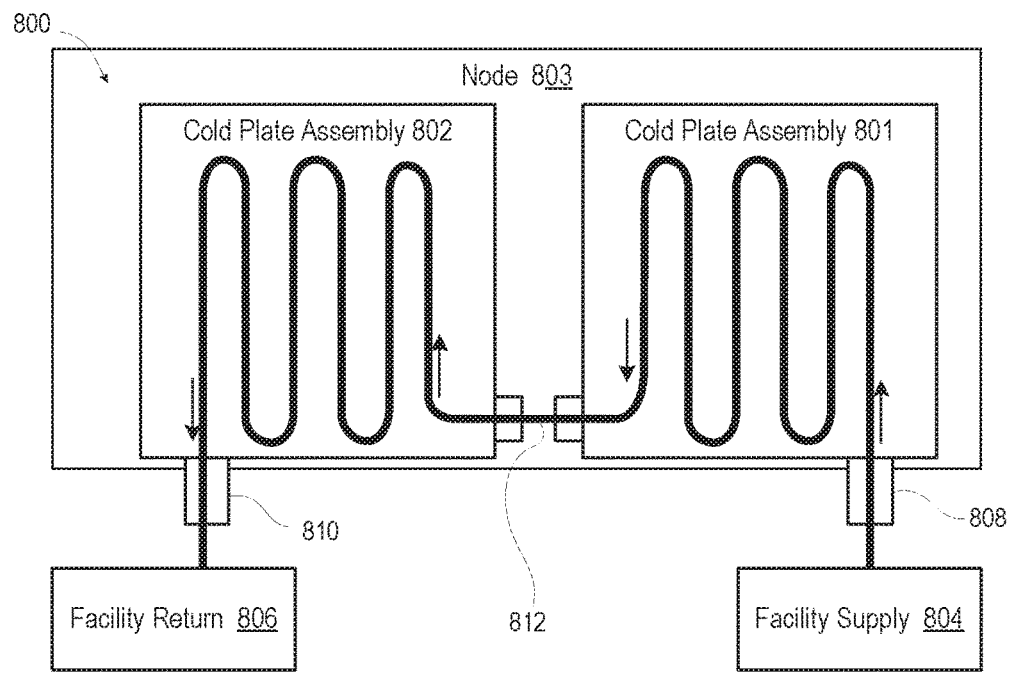
FIG. 8 illustrates a diagrammatic view of serial fluid flow through a pair of cold plates, according to one or more embodiments.

FIG. 8 illustrates a LC subsystem 800 having first and second cold plates 801, 802 inside of a node 803 and in serial fluid connection between a facility supply 804 and a facility return 806. Cold plate 801 has liquid input port 808 and cold plate 802 has liquid output port 810 that are respectively connected to the facility supply 804 and a facility return 806. All of the fluid flow is pre-heated by the first cold plate 801, passes through an internal liquid conduit 812 to the second cold plate 802, and then exits to the facility return 806.

Figure 9:
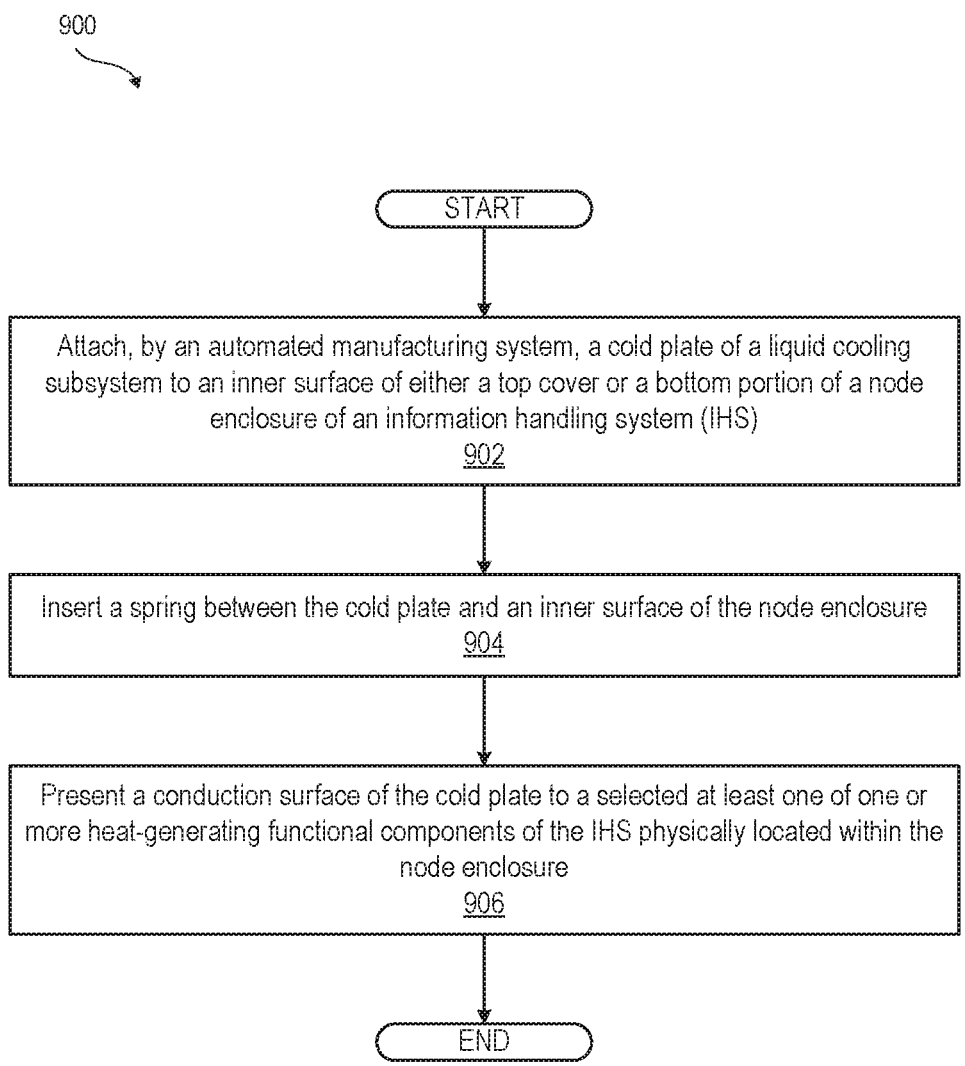
FIG. 9 illustrates a flow diagram of a method of assembling a LC node with a cold plate assembly, according to one or more embodiments.

FIG. 9 illustrates a method 900 for liquid cooling of a functional component within an IHS node. In one or more embodiments, method 900 begins with attaching, by an automated manufacturing system, a cold plate of a liquid cooling subsystem to an inner surface of either a top cover or a bottom portion of a node enclosure for use as/within an IHS (block 902). Method 900 includes inserting a spring between the cold plate and an inner surface of the node enclosure (block 904). Method 900 includes presenting a conduction surface of the cold plate to a selected one or more heat-generating functional components of the IHS physically located within the node enclosure (block 906). Then method 900 ends.

In one or more embodiments, the cold plate is mounted within the top cover of the node enclosure and method 900 includes presenting the conduction surface of the cold plate by closing the top cover of the node enclosure on a bottom portion of the node enclosure to place the conduction surface into conductive proximity with the selected one or more heat-generating functional components that is attached to the bottom portion.

In one or more embodiments, the cold plate is mounted within/on the bottom of the node enclosure and method 900 includes presenting the conduction surface of the cold plate by positioning the selected at least one of the one or more heat-generating functional components on top of the cold plate and closing a top cover of the node enclosure on the bottom portion.

In the above described flow chart of FIG. 9, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a node enclosure containing one or more heat-generating functional components;
   a cold plate attached to an inner surface of the node enclosure and presenting a conduction surface to a selected at least one of the one or more heat-generating functional components;
   a compliant, thermally conductive member placed between the cold plate and the selected at least one of the one or more heat-generating function components;
   a spring positioned between the inner surface of the node enclosure and the cold plate to position the conduction surface into conductive proximity with the selected at least one of the one or more heat-generating functional components;
   wherein the cold plate, the spring, and the compliant, thermally conductive member comprise a first cold plate assembly that is attached beneath the selected at least one of the one or more heat-generating functional components; and a second cold plate assembly attached above another one of the one or more heat-generating functional components.

2. The IHS of claim 1, further comprising a rack having a selected one of one or more node-receiving slots that receives the node enclosure.

3. The IHS of claim 1, wherein the spring comprises a leaf spring.

4. The IHS of claim 1, wherein the spring comprises a compression spring.

5. The IHS of claim 1, wherein the cold plate, the spring, and the compliant, thermally conductive member comprise a first cold plate assembly, the IHS further comprising:
a second cold plate assembly that conductively removes thermal energy from another one of the one or more heat-generating functional components;
a liquid input port and a liquid output port attached to a side of the node enclosure; and
an internal liquid conduit assembly connecting the first and second cold plate assemblies in fluid series between the liquid input and output ports.

6. The IHS of claim 5, wherein the one or more heat-generating functional components comprise first and second graphics processing units (GPU).

7. The IHS of claim 1, wherein:
the node enclosure comprises a bottom portion and a top cover;
the first cold plate assembly is attached to the bottom portion of the node enclosure; and
the second cold plate assembly is attached to the top cover.

8. A liquid cooling (LC) subsystem comprising:
a cold plate attachable to an inner surface of a node enclosure of an Information Handling System (IHS) and presenting a conduction surface to a selected one or more heat-generating functional components inside the node enclosure;
a compliant, thermally conductive member placed between the cold plate and the selected at least one of the one or more heat-generating function components;
a spring positionable between the inner surface of the node enclosure and the cold plate to position the conduction surface into conductive proximity with the selected one or more heat-generating functional components;
wherein the cold plate, the spring, and the compliant, thermally conductive member comprise a first cold plate assembly that is attached beneath the selected at least one of the one or more heat-generating functional components; and
the LC subsystem further comprising a second cold plate assembly that is attached above another one of the one or more heat-generating functional components.

9. The LC subsystem of claim 8, wherein the spring comprises a leaf spring.

10. The LC subsystem of claim 8, wherein the spring comprises a compression spring.

11. The LC subsystem of claim 8, wherein:
the second cold plate assembly conductively removes thermal energy from another one of the one or more heat-generating functional components; and
the LC subsystem further comprises:
a liquid input port and a liquid output port attached to a selected side of the node enclosure; and
an internal liquid conduit assembly connecting the first and second cold plate assemblies in fluid series between the liquid input and output ports.

12. The LC subsystem of claim 8, further comprising:
a rack-mounted supply conduit attachable between a liquid supply and a liquid input port; and
a rack-mounted return conduit attachable between a liquid return and a liquid output port.

13. The LC subsystem of claim 8, wherein:
the first cold plate assembly is attached to a bottom portion of the node enclosure; and
the second cold plate assembly is attached to a top cover.

14. A method comprising:
attaching a cold plate of a liquid cooling subsystem to an inner surface of a node enclosure of an information handling system (IHS);
inserting a spring between the cold plate and the inner surface of the node enclosure; and
presenting a conduction surface of the cold plate to a selected one or more heat-generating functional components of the IHS physically located within the node enclosure;
providing a compliant, thermally conductive member placed between the cold plate and the selected at least one of the one or more heat-generating function components;
wherein the cold plate, the spring, and the compliant, thermally conductive member comprise a first cold plate assembly that is attached beneath the selected at least one of the one or more heat-generating functional components; and
providing a second cold plate assembly attached above another one of the one or more heat-generating functional components.

15. The method of claim 14, wherein:
attaching the cold plate to the inner surface of the node enclosure comprises mounting the cold plate to a top cover of the node enclosure; and
presenting the conduction surface of the cold plate comprises closing the top cover of the node enclosure on a bottom portion of the node enclosure to place the conduction surface into conductive proximity with the selected one or more heat-generating functional components that is attached to the bottom portion.

16. The method of claim 14, wherein:
attaching the cold plate to the inner surface of the node enclosure comprises mounting the cold plate to a bottom portion of the node enclosure; and
presenting the conduction surface of the cold plate comprises positioning the selected at least one of the one or more heat-generating functional components on top of the cold plate and closing a top cover of the node enclosure on the bottom portion.

* * * * *